United States Patent
Sen et al.

(10) Patent No.: US 12,297,367 B2
(45) Date of Patent: May 13, 2025

(54) ENCAPSULATION MATERIALS FOR FLAT OPTICAL DEVICES

(71) Applicant: Applied Materials, Inc., Santa Clara, CA (US)

(72) Inventors: Srobona Sen, Mumbai (IN); Tapashree Roy, Bangalore (IN); Prerna Sonthalia Goradia, Mumbai (IN); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 563 days.

(21) Appl. No.: 17/004,114

(22) Filed: Aug. 27, 2020

(65) Prior Publication Data

US 2022/0064474 A1 Mar. 3, 2022

(51) Int. Cl.
*C09D 127/18* (2006.01)
*C09D 183/08* (2006.01)

(52) U.S. Cl.
CPC ......... *C09D 127/18* (2013.01); *C09D 183/08* (2013.01)

(58) Field of Classification Search
CPC ............................ C09D 127/18; C09D 183/08
USPC ....................................................... 428/161
See application file for complete search history.

(56) References Cited

U.S. PATENT DOCUMENTS

| | | | |
|---|---|---|---|
| 9,449,871 B1 * | 9/2016 | Bergendahl ....... | H01L 21/76879 |
| 2004/0125266 A1 | 7/2004 | Miyauchi et al. | |
| 2005/0117866 A1 | 6/2005 | Park et al. | |
| 2007/0223867 A1 * | 9/2007 | Hwang ................ | G02B 6/10 |
| | | | 427/162 |
| 2015/0079793 A1 | 3/2015 | Hattori et al. | |
| 2016/0225716 A1 * | 8/2016 | Lu ...................... | H01L 23/5329 |
| 2017/0290958 A1 * | 10/2017 | Balic .................. | A61L 27/50 |
| 2019/0318957 A1 * | 10/2019 | Godet ............... | H01L 21/32134 |

(Continued)

FOREIGN PATENT DOCUMENTS

| | | | | |
|---|---|---|---|---|
| EP | 1416303 A2 * | 5/2004 | ........ | B01L 3/502707 |
| JP | 2002517343 A | 6/2002 | | |

(Continued)

OTHER PUBLICATIONS

Machine_English_translation_JP_2005266343_A; Shibuya, Optical Member; EPO; whole document (Year: 2023).*

(Continued)

*Primary Examiner* — Tahseen Khan
(74) *Attorney, Agent, or Firm* — Patterson + Sheridan, LLP (57) ABSTRACT

Embodiments described herein relate to flat optical devices and encapsulation materials for flat optical devices. One or more embodiments include a substrate having a first arrangement of a first plurality of pillars formed thereon. The first arrangement of the first plurality of pillars includes pillars having a height h and a lateral distance d. The first arrangement of the first plurality of pillars includes a gap g corresponding to a distance between adjacent pillars of the first plurality of pillars. An aspect ratio of the gap g to the height h is between about 1:1 and about 1:20. A first adhesion-promoting material is disposed over the first arrangement of the first plurality of pillars. A first encapsulation layer is disposed over the first adhesion-promoting material. The first encapsulation layer fills the gap g between adjacent pillars of the first plurality of pillars. The first encapsulation layer includes a fluoropolymer.

20 Claims, 6 Drawing Sheets

(56) References Cited

U.S. PATENT DOCUMENTS

| | | | |
|---|---|---|---|
| 2019/0360041 A1 | 11/2019 | Wu et al. | |
| 2019/0386251 A1 | 12/2019 | Erickson et al. | |
| 2020/0166783 A1 | 5/2020 | Roy et al. | |
| 2020/0400990 A1* | 12/2020 | Godet | G02B 5/1838 |

FOREIGN PATENT DOCUMENTS

| | | | |
|---|---|---|---|
| JP | 2005266343 A | * | 9/2005 |
| WO | 2019203926 A | | 10/2019 |
| WO | WO2019203926 | | 10/2019 |

OTHER PUBLICATIONS

International Search Report dated Nov. 24, 2021 for Application No. PCT/US2021/043501.

"Chu Donghui et al: ""Effects of geometric parameters for superhydrophobicity of polymer surfaces fabricated by precision tooling machines""", Microsystem Technolog I ES, [Online] vol. 20, na. 2,5 Mar. 5, 2013 (Mar. 5, 2013), pp. 193-200, XP0931 95478, DE ISSN: A946-7A76, DOI: 1 0.1 0071s00542-01 3-1 758-3".

Milionis Athanasios et al: "Combination of Lithography and Coating Methods for Surface Wetting Control" In: "Updates in Advanced Lithography", Jul. 3, 2013 (Jul. 3, 2013), InTech, xP05591 2911,ISBN: 978-953-51-1 17 5-7, pp. 123-1 44, DOI: 1 4.5772156173.

Sanghyuk Wooh et al: "Trilevel-Structured 12, Superhydrophobic Pillar Arrays with Tunable Optical Functions" Advanced Functional Materials, Wiley-VC H Verijag G!{BTI & Co. KGAA, DE, vol. 24, No. 35, Jun. 18, 20L4 (May 18, 2014), pp. 5550-5556, xPA72296375, ISSN: 1616-301X, DOI.

European Search Report dated Sep. 3, 2024 re: European Application No. 218623293.6.

Search Report Dated Oct. 4, 2024 re: Taiwanese Patent Application No. 110131561.

Taiwan Office Action issued to Patent Application No. 110131561 on Mar. 15, 2024.

Japanese Office Action issued to patent application No. 2023-512648 on Feb. 6, 2024.

Japanese Office Action issued to patent application No. 2023-512648 on Jun. 11, 2024.

Korean Office Action Dated Dec. 2, 2024; re: Korean Patent Application No. 10-2023-7009977.

* cited by examiner

ENCAPSULATION MATERIALS FOR FLAT OPTICAL DEVICES

BACKGROUND

Field

Embodiments of the present disclosure generally relate to optical devices. More specifically, embodiments described herein relate to flat optical devices and encapsulation materials for flat optical devices.

Description of the Related Art

Flat optical devices include arrangements of pillars with in-plane dimensions smaller than half a design wavelength of light, and the out-of-plane dimension of the order of or larger than the design wavelength. A flat optical device may consist of a single, or multiple layers of nanostructured pillars. The pillars of a flat optical device need encapsulation to serve as a protective layer as well as to function as the spacer layer between successive layers of a multilayer arrangement. However, for nanostructured flat optical devices, filling in high aspect ratio openings is often challenging and results in non-uniform gap-fill. Furthermore, the encapsulation of the pillars increases the height of the pillars, and thus increases the total thickness of the flat optical device. The increase in the total thickness of the flat optical device lowers transmission efficiency and increases manufacturing complexity and cost. Therefore, what is needed in the art are improved flat optical devices and encapsulation materials for flat optical devices.

SUMMARY

In one or more embodiments, a device is provided and includes a substrate having a first arrangement of a first plurality of pillars formed thereon. The first arrangement of the first plurality of pillars includes pillars having a height h and a lateral distance d. The first arrangement of the first plurality of pillars includes a gap g corresponding to a distance between adjacent pillars of the first plurality of pillars. An aspect ratio of the gap g to the height h is between about 1:1 and about 1:20. A first adhesion-promoting material is disposed over the first arrangement of the first plurality of pillars. A first encapsulation layer is disposed over the first adhesion-promoting material. The first encapsulation layer fills the gap g between adjacent pillars of the first plurality of pillars. The first encapsulation layer includes a fluoropolymer.

In other embodiments, a method is provided and includes forming a first arrangement of a first plurality of pillars on a surface of a substrate. The first arrangement of the first plurality of pillars includes pillars having a height h and a lateral distance d and a gap g corresponding to a distance between adjacent pillars of the first plurality of pillars. An aspect ratio of the gap g to the height h is between about 1:1 and about 1:20. The method includes disposing a first adhesion-promoting material over the first arrangement of the first plurality of pillars. The method includes disposing a first encapsulation layer over the first adhesion-promoting material. The first encapsulation layer fills the gap g between adjacent pillars of the first plurality of pillars. The first encapsulation layer includes a fluoropolymer.

In other embodiments, a device is provided and includes a substrate having a first arrangement of a first plurality of pillars formed thereon. The first arrangement of the first plurality of pillars includes pillars having a first surface facing away from the substrate, one or more side surfaces facing adjacent pillars, and trenches formed between adjacent pillars. The device includes a first adhesion-promoting material disposed on the first surface and the one or more side surfaces of the pillars. The first adhesion-promoting material includes a fluorosilane. The device includes a first encapsulation layer disposed over the first adhesion-promoting material. The first encapsulation layer fills the trenches between adjacent pillars of the first plurality of pillars and includes an amorphous fluoropolymer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to flat optical devices and encapsulation materials for flat optical devices. One or more embodiments include a substrate having a first arrangement of a first plurality of pillars formed thereon. The first arrangement of the first plurality of pillars includes pillars having a height h and a lateral distance d. The first arrangement of the first plurality of pillars includes a gap g corresponding to a distance between adjacent pillars of the first plurality of pillars. An aspect ratio of the gap g to the height h is between about 1:1 and about 1:20. A first adhesion-promoting material is disposed over the first arrangement of the first plurality of pillars. A first encapsulation layer is disposed over the first adhesion-promoting material. The first encapsulation layer fills the gap g between adjacent pillars of the first plurality of pillars. The first encapsulation layer includes a fluoropolymer.

Figure 1A:
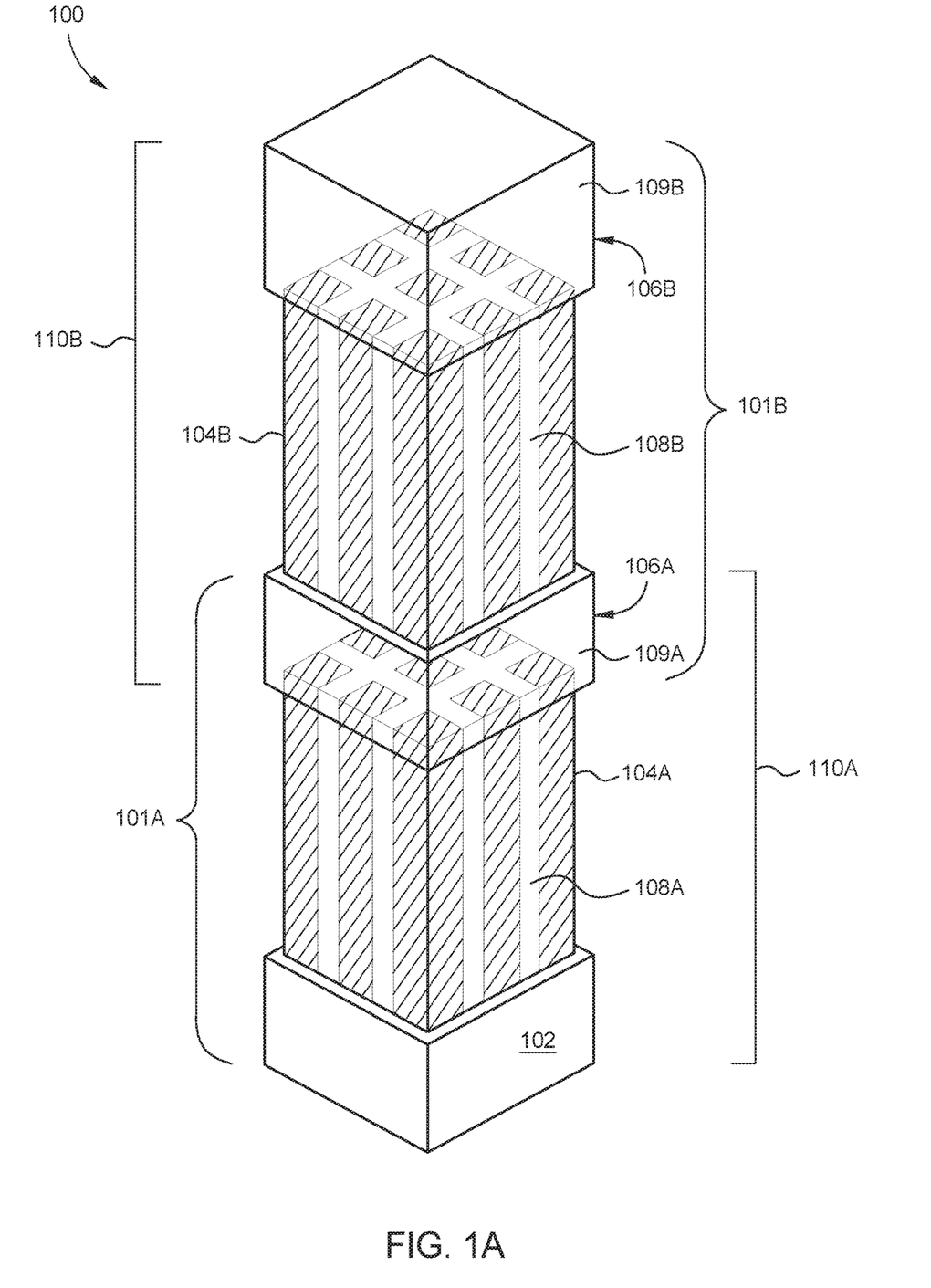
FIG. 1A is a schematic, perspective view of a flat optical device according to one or more embodiments described herein.
Figure 1B:
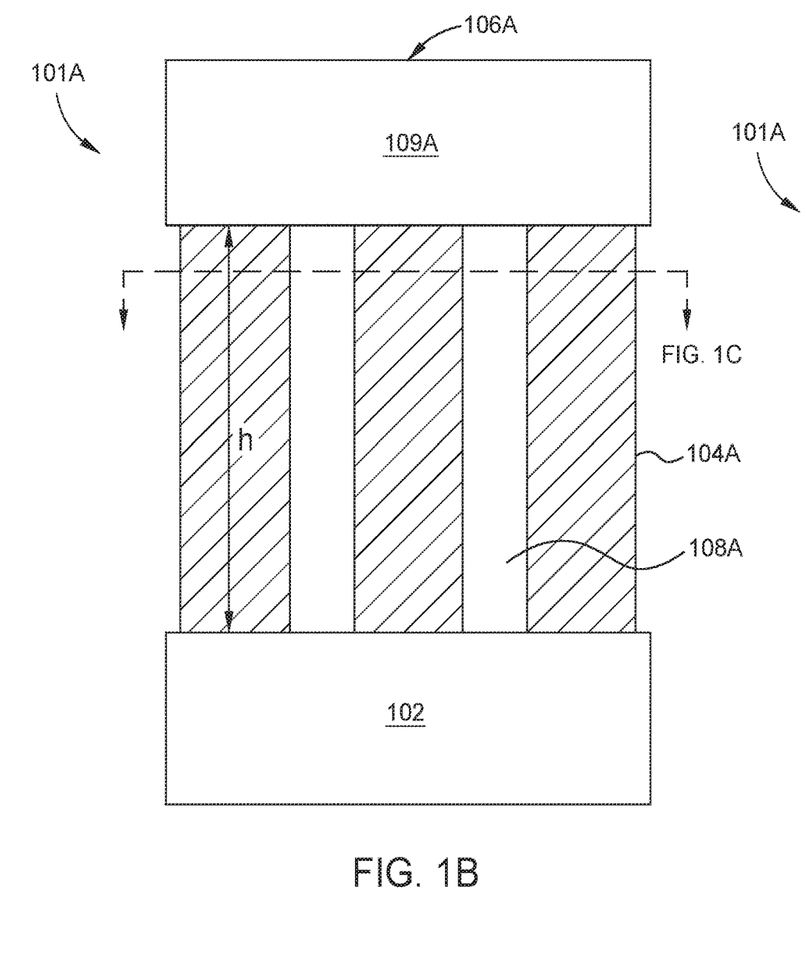
FIG. 1B is a schematic, cross-sectional view of a layer stack according to one or more embodiments described herein.
Figure 1C:
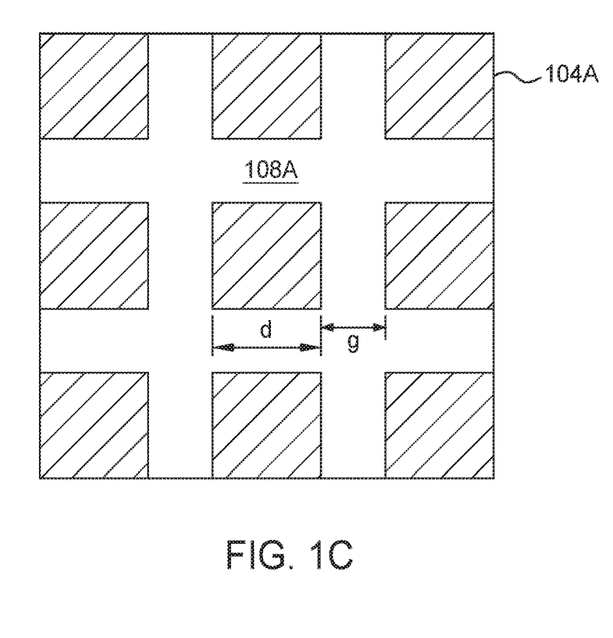
FIG. 1C is a schematic, top view of an arrangement of pillars of a layer stack according to one or more embodiments described herein.

FIG. 1A is a schematic, perspective view of a flat optical device 100 having at least one layer stack 101A, 101B. FIG. 1B is a schematic, cross-sectional view of the layer stack 101A. FIG. 1C is a schematic, top view of an arrangement of pillars 104 of the layer stack 101A. The flat optical device 100 includes at least one layer stack 101A, 101B. While aspects of the devices and methods described herein may be discussed in reference to the layer stack 101A, it is to be understood that aspects of the devices and methods described herein are similarly applicable to the layer stack 101B. Reference numerals may be omitted for the arrangement of the layer stack 101B for clarity in the Figures provided herein.

In one or more embodiments, which can be combined with other embodiments described herein, the flat optical device 100 is a single layer stack flat optical device that includes the layer stack 101A. In other embodiments, which can be combined with other embodiments described herein, the flat optical device 100 is a multi-layer stack optical device that includes the layer stack 101A and one or more layer stacks 101B. The layer stack 101A includes an arrangement of a plurality of pillars 104A disposed on a surface of the substrate 102 and an encapsulation layer 106A. The encapsulation layer 106A includes a gap-fill portion 108A and a cap portion 109A. In the illustrated embodiments of the multi-layer stack optical device, the first layer stack of the one or more layer stacks 101B is disposed over the layer stack 101A. In some other embodiments, the one or more layer stacks 101B are disposed on a second surface of the substrate 102 opposite the first surface. In other words, the layer stack 101A and the one or more layer stacks 101B are disposed on opposite sides of the substrate 102. In one or more embodiments, which can be combined with other embodiments described herein, the first layer stack of the layer stacks 101B includes an arrangement of a plurality of pillars 104B disposed on the cap portion 109A of the encapsulation layer 106A. In other embodiments, which can be combined with other embodiments described herein, the arrangement of a plurality of pillars 104B of the first layer stack of the layer stacks 101B is disposed on a spacer layer (not shown) disposed on the encapsulation layer 106A. In embodiments including the spacer layer, the spacer layer is operable to provide support for the arrangement of the plurality of pillars 104B, and is of a specified thickness (e.g., up to about 50 μm) according to the optical functionality of the flat optical device 100. In one or more embodiments, which can be combined with other embodiments described herein, the encapsulation layer 106A and the spacer layer are formed from different materials. In other embodiments, the cap portion 109A of the encapsulation layer 106A provides the same function as the spacer layer. In embodiments where the encapsulation layer 106A functions as the spacer layer, the encapsulation layer 106A is of a specified thickness according to the optical functionality of the flat optical device 100.

The arrangement of the plurality of pillars 104A, 104B includes pillars 104A, 104B having a height h and a lateral distance d. The height h of the pillars 104A is defined as the distance from the surface of the substrate 102 to the cap portion 109A of the encapsulation layer 106A. The height h of the pillars 104B is defined as the distance from the encapsulation layer 106A and/or a spacer layer (not shown) disposed on the encapsulation layer 106A to the cap portion 109B of the encapsulation layer 106B. In some embodiments, the plurality of pillars 104A, 104B include 4 or more pillars, such as from 4 to about $10^6$ pillars or greater, depending on feature density and wafer size. In some embodiments, which can be combined with other embodiments described herein, the cross-section of the pillars 104A, 104B is square and/or rectangular and the lateral distance d of the pillars 104A, 104B corresponds to a width of the pillars 104A, 104B. In other embodiments, which can be combined with other embodiments described herein, the cross-section of the pillars 104A, 104B is circular and the lateral distance d of the pillars 104A, 104B corresponds to a diameter of the pillars 104A, 104B. The gap g is a distance between adjacent pillars of the pillars 104A, 104B. In one or more embodiments, each of the arrangement of the plurality of pillars 104A, 104B has an aspect ratio (g:h) between about 1:1.5 and about 1:10. In other embodiments, each of the arrangement of the plurality of pillars 104A, 104B has an aspect ratio (g:h) between about 1:1.5 and about 1:2.5. In yet other embodiments, each of the arrangement of the plurality of pillars 104A, 104B has an aspect ratio (g:h) between about 1:1 and about 1:20.

The lateral distance d and the gap g are less than half of a wavelength of operation. The wavelength of operation corresponds to a wavelength or wavelength range. In some examples, the wavelength or wavelength range includes one or more wavelengths in the UV region to near-infrared region (e.g., from about 300 nm to about 1500 nm). Therefore, for example, at a wavelength of 700 nm the distance d and the gap g are less than 350 nm. In some embodiments, the gap g may be about 100 nm or less. In one or more embodiments, which can be combined with other embodiments described herein, the lateral distance d of each pillar of the plurality of pillars 104A is substantially the same. In other embodiments, which can be combined with other embodiments described herein, the lateral distance d of at least one pillar is different than the lateral distance d of additional pillars of the plurality of pillars 104A. In one or more embodiments, which can be combined with other embodiments described herein, the gap g of each of the adjacent pillars of the plurality of pillars 104A is substantially the same. In other embodiments, which can be combined with other embodiments described herein, the gap g of at least one set of adjacent pillars is different than the gap g of additional sets of adjacent pillars of the plurality of pillars 104A. In one or more embodiments, which can be combined with other embodiments described herein, the lateral distance d of each of the adjacent pillars of the plurality of pillars 104A is greater than the gap g of each of the adjacent pillars of the plurality of pillars 104A. In some embodiments, which can be combined with other embodiments described herein, the distance d is from about 100 nm to about 300 nm, and the gap g is from about 30 nm to about 100 nm. In some embodiments, which can be combined with other embodiments described herein, the arrangement of the plurality of pillars 104B corresponds to or otherwise matches the arrangement of the plurality of pillars 104A. In other embodiments, which can be combined with other embodiments described herein, the arrangement of the plurality of pillars 104B does not correspond to the arrangement of the plurality of pillars 104A.

The substrate 102 may be selected to transmit light at the wavelength of operation. Without limitation, in some embodiments, the substrate 102 is configured such that the substrate 102 transmits greater than or equal to about 50%, 60%, 70%, 80%, 90%, 95%, 99% of the UV region of the light spectrum. The substrate 102 may be formed from any suitable material, provided that the substrate 102 can adequately transmit light of the wavelength of operation and can serve as an adequate support for at least the arrangement of the plurality of pillars 104A and the encapsulation layer 106A. In some embodiments, which can be combined with other embodiments described herein, the material of substrate 102 has a refractive index that is relatively low, as compared to the refractive index of materials used in each of the pillars 104A, 104B. Substrate selection may include substrates of any suitable material, including, but not limited to, semiconductor, doped semiconductor, amorphous dielectrics, non-amorphous dielectrics, crystalline dielectrics, silicon oxide, polymers, and combinations thereof. In some embodiments, which can be combined with other embodiments described herein, the substrate 102 includes a transparent material. The substrate 102 is transparent with an absorption coefficient less than 0.001. Examples may include, but are not limited to, an oxide, sulfide, phosphide, telluride, and combinations thereof. In one example, the substrate 102 includes silica ($SiO_2$) containing materials.

The pillars 104A, 104B include materials, not limited to, titanium dioxide ($TiO_2$), zinc oxide (ZnO), tin dioxide ($SnO_2$), aluminum-doped zinc oxide (AZO), fluorine-doped tin oxide (FTO), cadmium stannate (tin oxide) (CTO), zinc stannate (tin oxide) ($SnZnO_3$), and silicon containing materials. The silicon containing materials may include at least one of silicon nitride ($Si_3N_4$) or amorphous silicon (a-Si) containing materials. The pillars 104A, 104B may have a refractive index of about 1.8 or greater, such as from about 1.8 to about 6, such as from about 1.8 to about 5, such as from about 1.8 to about 4. The pillars 104A, 104B may have an absorption coefficient less than about 0.001, such as from about 0 to about 0.001, such as from about 0.00001 to about 0.001, such as from about 0.0001 to about 0.001.

Utilization of the materials, dimensions, and processes described herein of the encapsulation layer 106A, 106B, including the composition of the gap-fill portion 108A, 108B corresponding to the gap g, provides for a height h of the pillars 104A, 104B of about 1500 nm or less. In some embodiments, which can be combined with other embodiments described herein, the height h of the pillars 104A, 104B is about 500 nm or less. In some embodiments, which can be combined with other embodiments described herein, the height h of the pillars 104A, 104B is from about 300 nm to about 1500 nm. Lowering the height h of the pillars 104A, 104B reduces the thickness 110A, 110B of the layer stack 101A, 101B and total thickness of the flat optical device 100. The reduced total thickness of the flat optical device 100 provides for higher transmission efficiency due to impedance matching and device symmetry, as compared to bare optical devices, and reduced manufacturing complexity and cost.

In some embodiments, which can be combined with other embodiments described herein, the refractive index of the encapsulation layer 106A, 106B is about 1.0 to about 1.5, such as from about 1.0 to about 1.45, such as from about 1.0 to about 1.4, such as from about 1.0 to about 1.3, such as from about 1.0 to about 1.2, such as from about 1.0 to about 1.1, alternatively from about 1.3 to about 1.4, alternatively from about 1.25 to about 1.35. In some embodiments, it may be desirable that the refractive index of the encapsulation layer 106A, 106B approaches that of air (e.g., 1.0) to match the performance of optical devices without a global encapsulant. In some embodiments, which can be combined with other embodiments described herein, the encapsulation layer 106A, 106B has an absorption coefficient less than about 0.001. In some embodiments, which can be combined with other embodiments described herein, the encapsulation layer 106A, 106B is hydrophobic to protect the pillars 104A from external factors (e.g., water, corrosion). In some embodiments, which can be combined with other embodiments described herein, the encapsulation layer 106A, 106B is homogeneous or uniform being substantially free of grain boundaries. In some embodiments, which can be combined with other embodiments described herein, the encapsulation layer 106A, 106B forms a dense film (e.g., being substantially void-free and having nominal porosity). In some embodiments, which can be combined with other embodiments described herein, the encapsulation layer 106A, 106B and the substrate 102 include substantially the same materials.

Figure 1D:
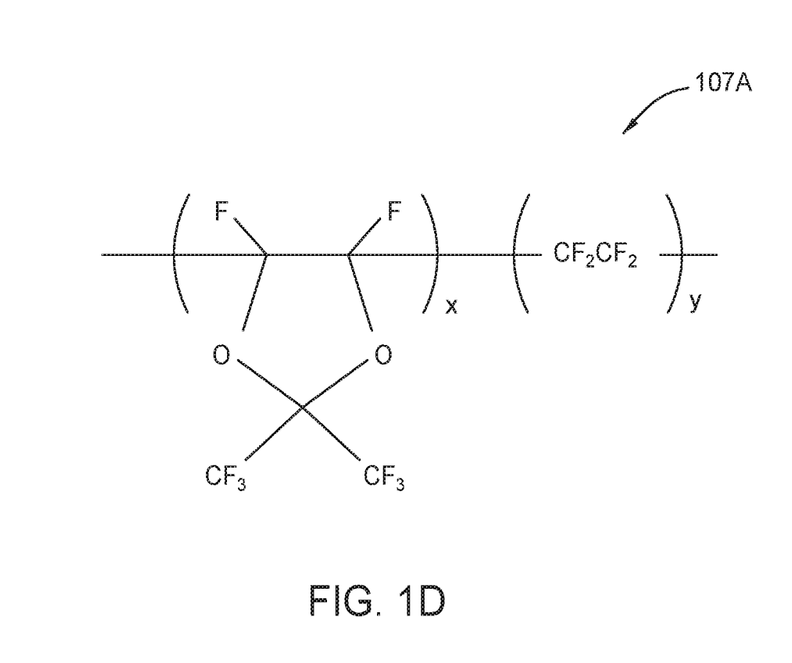
FIG. 1D-1E are exemplary structures of fluoropolymer encapsulation materials according to one or more embodiments described herein.
Figure 1E:
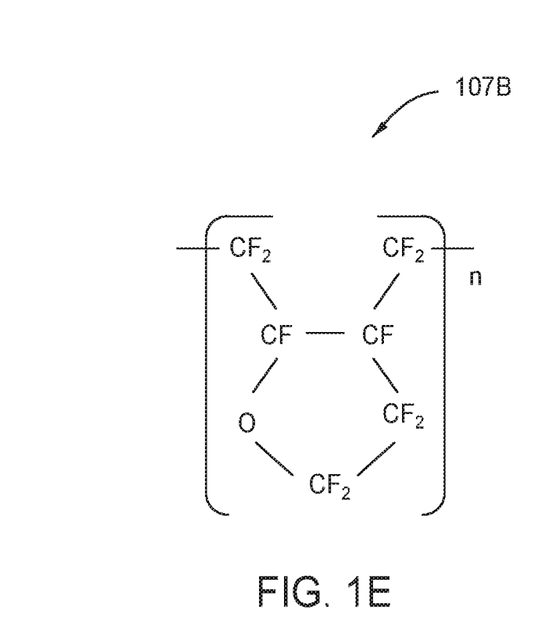

In some embodiments, which can be combined with other embodiments described herein, the encapsulation layer 106A, 106B includes one of silica containing materials or non-silica containing materials, such as polymer containing materials, for example, organic fluoropolymer materials. In some embodiments, which can be combined with other embodiments described herein, the encapsulation layer 106A, 106B includes an amorphous fluoropolymer. Compared to semi-crystalline fluoropolymers, amorphous fluoropolymers are highly optically transparent. In some embodiments, which can be combined with other embodiments described herein, the encapsulation layer 106A, 106B can be or include one of the fluoropolymers illustrated in FIGS. 1D-1E, e.g., poly[4,5-difluoro-2,2-bis(trifluoromethyl)-1,3-dioxole-co-tetrafluoroethylene] (structure 107A) or perfluoro(3-butenyl vinyl ether) (PBVE) cyclopolymer (structure 107B). Referring to structure 107A, the value of x may be from about 80 to about 12,500, such as from about 120 to about 9,000, such as from about 200 to about 5,000, such as from about 500 to about 1,000, such as about 870, and the value of y may be from about 80 to about 30,000, such as from about 300 to about 15,000, such as from about 300 to about 9,000, such as from about 500 to about 1,000, such as about 870. Referring to structure 107B, the value of n may be from about 30 to about 11,000, such as from about 50 to about 2,000, such as from about 100 to about 1,600, such as about 100, alternatively about 800, alternatively about 1,600. In other embodiments, the encapsulation layer 106A, 106B can be or include poly(tetrafluoroethylene-co-2,2,4-trifluoro-5-trifluoromethoxy-1,3-dioxole). In some embodiments, which can be combined with other embodiments described herein, the encapsulation layer 106B can be or include a fluoropolymer having one or more cross-linkable alkoxysilane moieties. In some embodiments, which can be combined with other embodiments described herein, the encapsulation layer 106A, 106B can be or include other tetrafluoroethylene copolymers. In some other embodiments, which can be combined with other embodiments described herein, the encapsulation layer 106A, 106B can be or include a C6 fluorocarbon, a perfluoropolyether poly-acrylate functional oligomer, 1H,1H,2H,2H-Heptadecafluorodecyl methacrylate (HDFDMA), poly(tert-butyl methacrylate-co-glycidyl methacrylate), poly(2,2,3,3,4,4,4-heptafluorobutyl acrylate), poly(2,2,3,3,4,4,4-heptafluorobutyl methacrylate), poly(2,2,3,3,4,4,4-heptafluorobutyl methacrylate-co-glycidyl methacrylate), poly(2,2,3,4,4,4-hexafluorobutyl acrylate), poly(2,2,3,4,4,4,-hexafluorobutyl methacrylate-co-glycidyl methacrylate), poly(1,1,1,3,3,3-hexafluoroisopropyl acrylate), poly(1,1,1,3,3,3-hexafluoroisopropyl methacrylate), poly(1,1,1,3,3,3-hexafluoroisopropyl methacrylate-co-glycidyl methacrylate), poly(2,2,3,3,3-pentafluoropropyl acrylate), poly(2,2,3,3,3-pentafluoropropyl methacrylate), poly(2,2,3,3,3-pentafluoropropyl methacrylate-co-glycidyl methacrylate), poly(pentafluorostyrene), poly(pentafluorostyrene-co-glycidyl methacrylate), poly(pentafluorostyrene-co-glycidyl methacrylate), poly(2,2,3,3-tetrafluoropropyl acrylate), poly (2,2,3,3-tetrafluoropropyl methacrylate), poly(2,2,2-trifluoroethyl acrylate), poly(2,2,2-trifluoroethyl methacrylate-co-glycidyl methacrylate), poly(2,2,2-trifluoroethyl methacrylate-co-glycidyl methacrylate), other similar polymers, or combinations thereof.

In one or more embodiments, the encapsulation layer 106A, 106B can be or include any fluoropolymer material having a refractive index less than about 1.5, such as from about 1 to about 1.5. In one or more embodiments, the encapsulation layer 106A, 106B includes a material being thermally stable up to about 250° C. In some embodiments, which can be combined with other embodiments described herein, the encapsulation layer 106A, 106B can be or include other fluorine containing materials, such as metal fluorides, e.g., aluminum fluoride ($AlF_3$) and magnesium fluoride ($MgF_2$).

Fluoropolymer-based encapsulation layers 106A, 106B can be advantageous for providing mechanical protection for nano-pillars of flat optical devices with low refractive index (e.g., refractive index less than about 1.5), high transparency (e.g., absorption coefficient less than about 0.001), and hydrophobicity (e.g., water contact angle of about 100° or greater). As used herein, a contact angle, which is measured at the solid-liquid interface, is the angle between a surface of the liquid and a contact surface of the solid, where the contact angle ranges from 0° for complete wetting to the theoretical upper limit of 180° for poor wetting. In addition, fluoropolymer-based global encapsulants can be advantageous for protecting slanted gratings of waveguide combiners and for use in flexible display technologies. Beneficially, fluoropolymer-based encapsulation layers 106A, 106B can improve shelf-life of flat optical devices. Beneficially, fluoropolymer-based encapsulation layers 106A, 106B, particularly the cap portion 109A, 109B can provide mechanical support and spacing for multi-layer flat optical devices. Beneficially, fluoropolymer-based encapsulation layers 106A, 106B can undergo further deposition processes (e.g., atomic layer deposition) of relatively high refractive index materials (e.g., $TiO_2$). Optical devices which may benefit from the present disclosure include lenses, beam deflectors, hologram generators, and diffusers.

In some embodiments, which can be combined with other embodiments described herein, the encapsulation layer 106A, 106B includes a fluoropolymer-based aerogel material. The fluoropolymer-based aerogel material includes nanoscale porosities to provide air gaps in the encapsulation layer 106A, 106B. In one or more embodiments, which can be combined with other embodiments described herein, the fluoropolymer-based aerogel material has a porosity, corresponding to the nanoscale air gaps, of about 95% or greater, such as from about 95% to about 99%. The nanoscale porosity of the fluoropolymer-based aerogel material reduces the refractive index of the fluoropolymer. The reduced refractive index decreases the height h of the pillars 104A, 104B. The fluoropolymer-based aerogel material is hydrophobic to protect the pillars 104A from external factors. In yet other embodiments, which can be combined with other embodiments described herein, the encapsulation layer 106A, 106B includes a fluoropolymer-based mesoporous coating.

In one or more embodiments, which can be combined with other embodiments described herein, the gap-fill portion 108A and the cap portion 109A are formed of the same material such that the encapsulation layer 106A has a uniform refractive index. In other embodiments, the gap-fill portion 108A and the cap portion 109A are formed of different materials having the same or different refractive index. In some embodiments, the refractive index of the gap-fill portion 108A is greater than the refractive index of the cap portion 109A. In other embodiments, the refractive index of the gap-fill portion 108A is less than the refractive index of the cap portion 109A. In some embodiments, the decreased height h of the pillars 104A can be used when the refractive index of the encapsulation layer 106A has a reduced value in the gap-fill portion 108A, in the cap portion 109A, or both.

Figure 2:
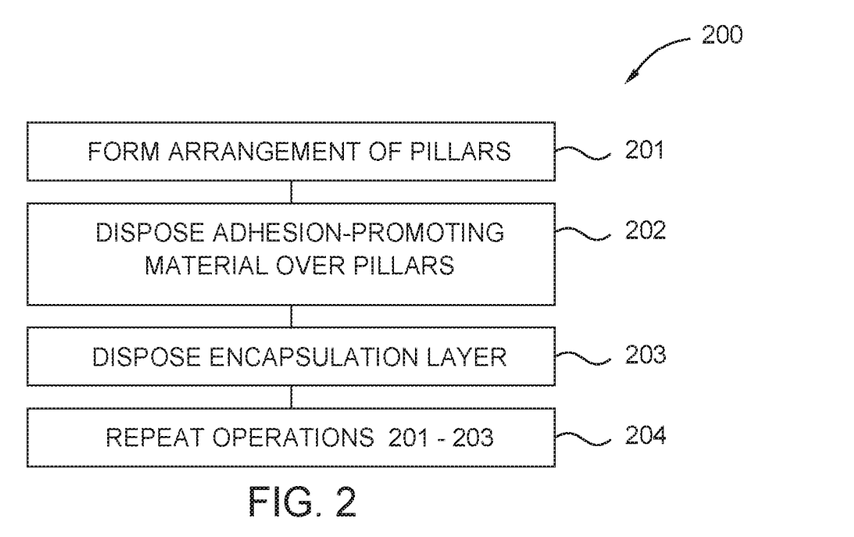
FIG. 2 is a diagram of a method of forming a flat optical device according to one or more embodiments described herein.

FIG. 2 is a diagram of a method 200 of forming a flat optical device 100, as shown in FIGS. 3A-3D. At operation 201, an arrangement of a plurality of pillars 104A is formed on the surface of the substrate 102. In one or more embodiments, which can be combined with other embodiments described herein, forming the arrangement of a plurality of pillars 104A includes disposing a pillar material 301 over the surface of the substrate 102 and removing portions of the pillar material 301 to form trenches 302. The trenches 302 correspond to the gap g of the pillars 104A (including the gap-fill portion 108A of the flat optical device 100), the remaining portions of the pillar material 301 correspond to the lateral distance d, and the thickness of the pillar material 301 corresponds to the height h.

At operation 202, an adhesion-promoting material 304 is disposed over the plurality of pillars 104A. The adhesion-promoting material 304 primes the pillars 104A for improving the flowability of the encapsulation layer 306A for filling the trenches 302. In some embodiments, which can be combined with other embodiments described herein, the adhesion-promoting material 304 includes a material having a hydrophobic tail group. In such embodiments, binding of the adhesion-promoting material 304 to exposed surfaces of the plurality of pillars 104A leaves the hydrophobic tail group exposed improving surface flowability and gap-fill of the encapsulation layer 306A resulting in a substantially void-free gap fill. In some embodiments, which can be combined with other embodiments described herein, the adhesion-promoting material 304 includes a fluorosilane material. In some embodiments, which can be combined with other embodiments described herein, the adhesion-promoting material 304 may include one of the materials illustrated in FIGS. 4A-4D, e.g., trichloro(1H,1H,2H,2H-perfluorooctyl)-silane (structure 400A), 1H, 1H,2H,2H-perfluorooctyltriethoxysilane (structure 400B), 1H, 1H,2H,2H-perfluorodecyltriethoxysilane (structure 400C), or trichloro (3,3,3-trifluoropropyl)-silane (structure 400D). In one or more embodiments, which can be combined with other embodiments described herein, the adhesion-promoting material 304 is conformably disposed over the pillars 104A. In one or more embodiments, which can be combined with other embodiments described herein, the adhesion-promoting material 304 is a monolayer. In some embodiments, the monolayer has a thickness of from about 1 nm to about 10 nm. In some embodiments, exposed surfaces of the flat optical device 100 are cleaned with a suitable cleaning solution, such as isopropyl alcohol, before the adhesion-promoting material 304 is disposed thereon. In some embodiments, the adhesion-promoting material 304 may be deposited by spin-coating. In one or more embodiments, which can be combined with other embodiments described herein, during the deposition process, the substrate 102 is rotated about a central axis 103 of the substrate 102. In some embodiments, the substrate 102 is rotated at about 200 rpm or more, such as about 500 rpm or more. In some embodiments, which can be combined with other embodiments described herein, after deposition of the adhesion-promoting material 304, the flat optical device 100 is heated and/or maintained at an elevated temperature. In some embodiments, the elevated temperature is greater than room temperature, such as about 23° C. or more, such as about 50° C. or more, such as about 80° C. or more, such as about 110° C. or more. In some embodiments, which can be combined with other embodiments described herein, the operations of spin-coating and heating are repeated two or more times. In some embodiments, which can be combined with other embodiments described herein, the adhesion-promoting material 304 is sonicated after heating.

Figure 3A:
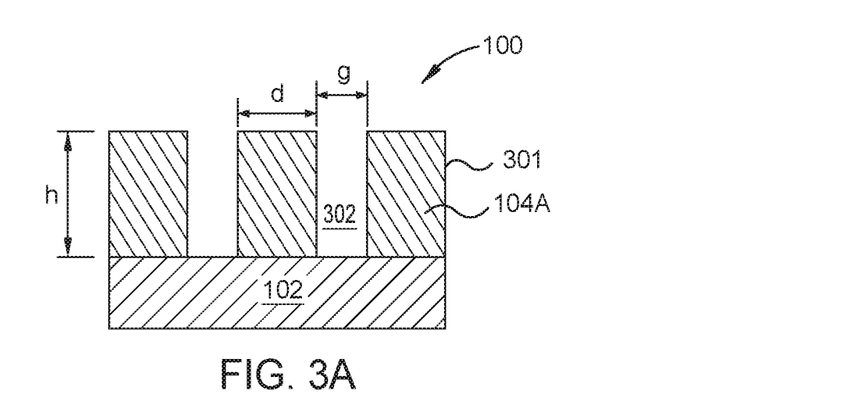
FIGS. 3A-3D are schematic, cross-sectional views of a substrate during a method of forming a flat optical device according to one or more embodiments described herein.
Figure 3B:
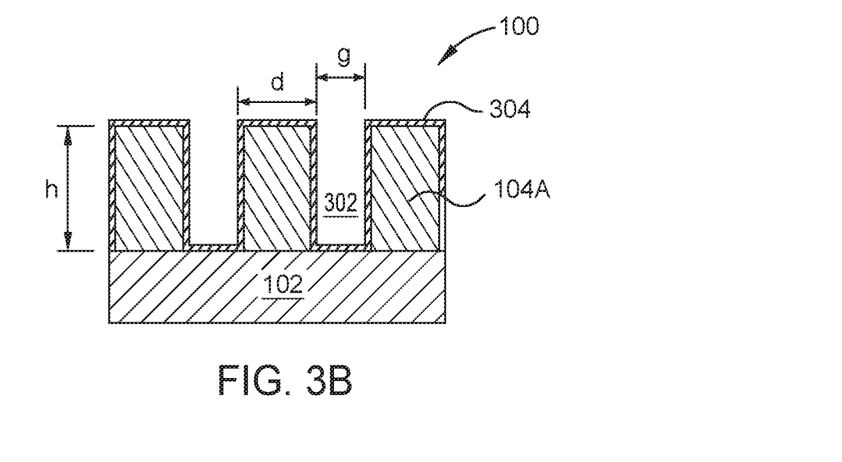
Figure 3C:
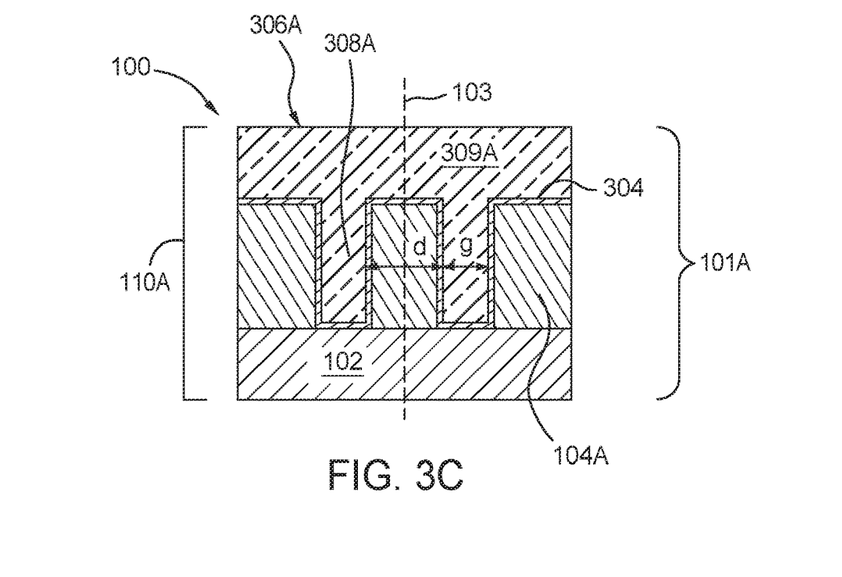

At operation 203, an encapsulation layer 306A, corresponding to the encapsulation layer 106A, is disposed over the pillars 104A. Disposing the encapsulation layer 306A may include, but is not limited to, spin-coating, dip-coating, spray-coating, vapor draw, or aerosolization. A gap-fill portion 308A of the encapsulation layer 306A, is disposed in the trenches 302 corresponding to the gap g of the pillars 104A. In some embodiments, disposing the adhesion-promoting material 304 over the plurality of pillars 104A before disposing the encapsulation layer 306A improves flowability and gap-fill of the gap-fill portion 308A. After applying the adhesion-promoting material 304 to exposed surfaces of the plurality of pillars 104A, the contact angle of the encapsulation layer 306A on coated surfaces of the plurality of pillars 104A is reduced to about 40° or less, such as about 30° or less, such as 20° or less. A cap portion 309A of the encapsulation layer 306A is disposed over and on top of the plurality of pillars 104A and over the gap-fill portion 308A. In some embodiments, the film thickness of the cap portion 309A can be modified by adjusting the solution concentration of the encapsulation material. In some embodiments, the solution concentration of the encapsulation material may be from about 0.1% v/v to about 10% v/v, such as from about 1% v/v to about 5% v/v, such as about 3% v/v. In one or more embodiments, which can be combined with other embodiments described herein, the cap portion 309A of the encapsulation layer 306A has a thickness of about 50 nm or greater, such as from about 50 nm to about 1 cm, such as from about 50 nm to about 1 mm, such as from about 50 nm to about 100 μm, such as from about 50 nm to about 10 μm. In other embodiments, which can be combined with other embodiments described herein, the cap portion 309A of the encapsulation layer 306A has a thickness of about 1 μm or less, such as from about 50 nm to about 1 μm. In one or more embodiments, which can be combined with other embodiments described herein, during the deposition process, the substrate 102 is rotated about the central axis 103 of the substrate 102. In some embodiments, the substrate 102 is rotated at about 1000 rpm or more, such as about 2000 rpm or more, alternatively from about 500 rpm to about 6000 rpm. In some embodiments, which can be combined with other embodiments described herein, after deposition of the encapsulation layer 306A, the flat optical device 100 is heated and/or maintained at an elevated temperature (e.g., up to about 275° C. or more) to promote curing of the encapsulation layer 306A. In other embodiments, the encapsulation layer 306A can be cured in air without heating.

Figure 3D:
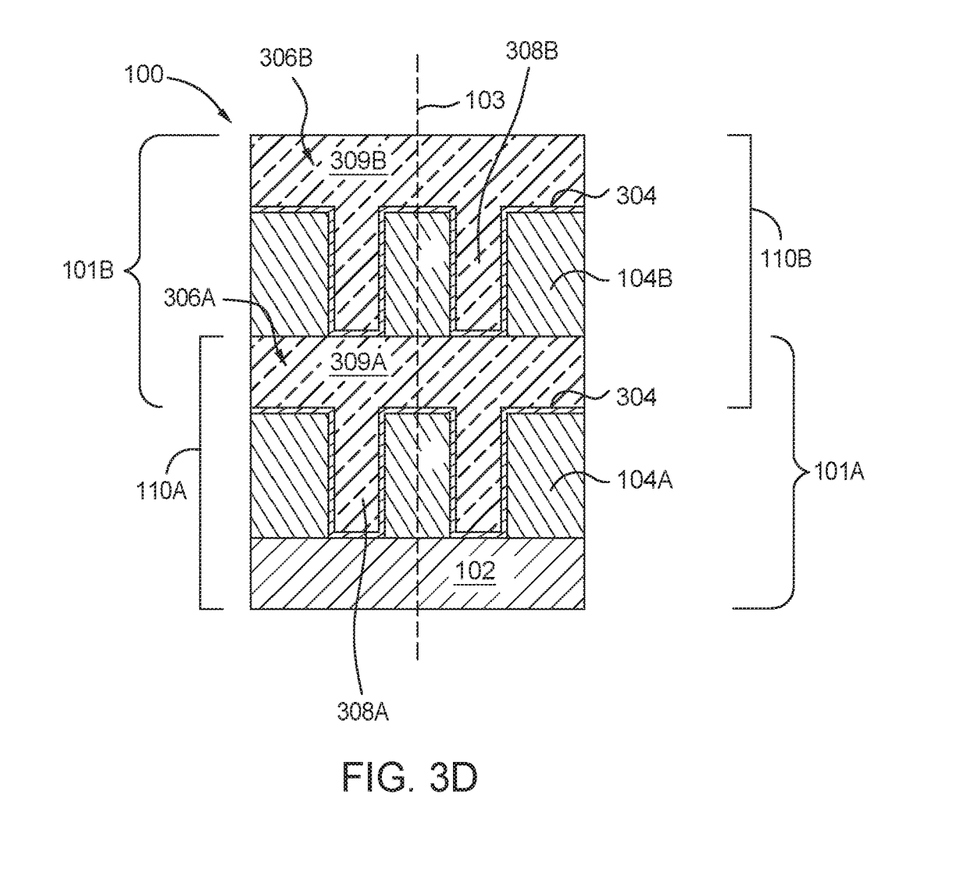
Figure 4A:
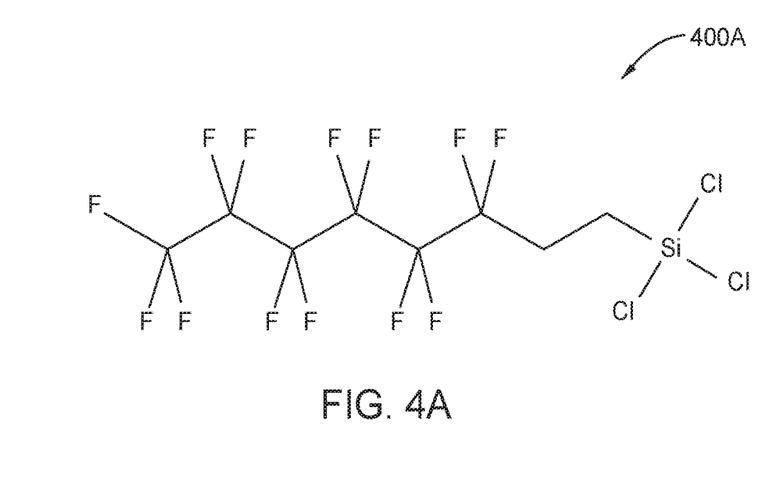
FIGS. 4A-4D are exemplary structures of adhesion-promoting materials according to one or more embodiments described herein.
Figure 4B:
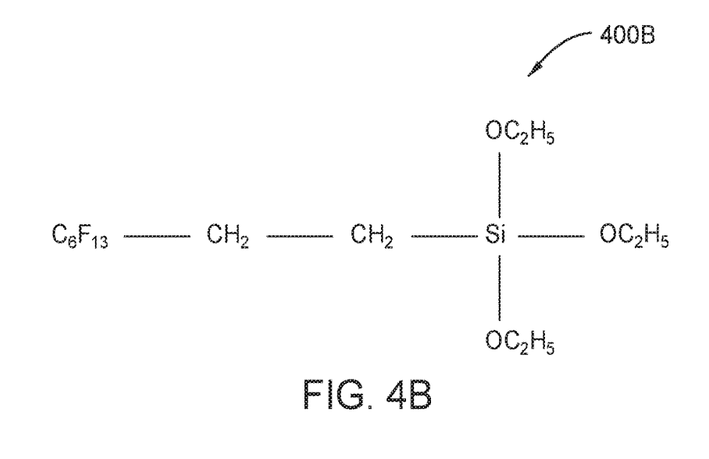
Figure 4C:
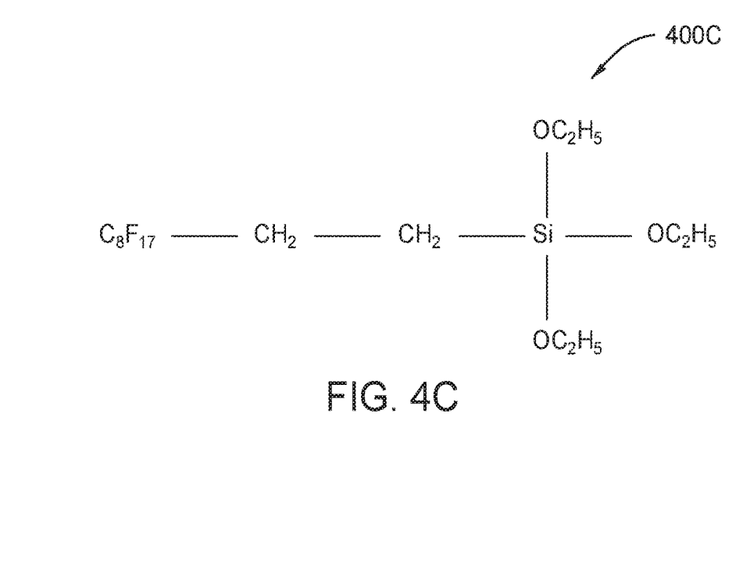
Figure 4D:
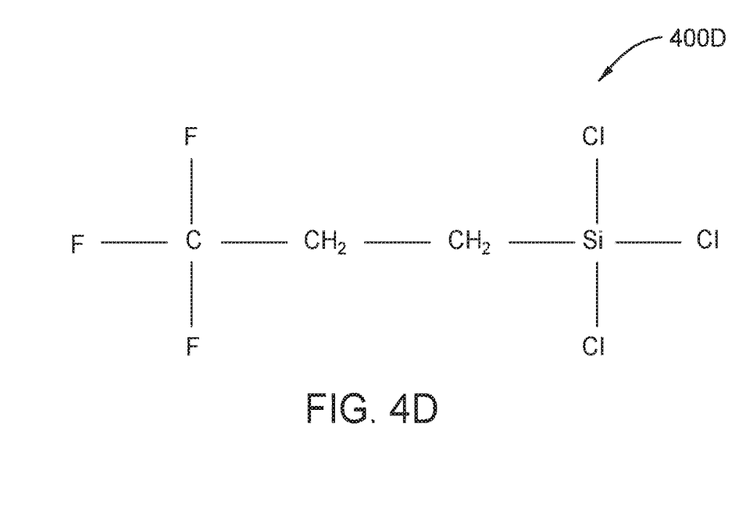

Operations 201-203 form a single layer stack flat optical device 100 that includes the layer stack 101A. At operation 204, at least operations 201-203 are repeated at least once to form a multi-layer stack optical device having the layer stack 101A and at least one layer stack 101B. The layer stack 101B includes at least the encapsulation layer 306A, the arrangement of a plurality of pillars 104B, and the encapsulation layer 306B. The arrangement of a plurality of pillars 104B formed via operation 201 is disposed on one of the encapsulation layer 306A and a spacer layer (not shown) is disposed on the encapsulation layer 306A.

In summation, embodiments described herein provide flat optical devices and methods of forming flat optical devices. One or more embodiments of the optical devices are single layer stack flat optical devices that include one layer stack. The layer stack includes a first arrangement of a first plurality of pillars disposed on a surface of a substrate and a first encapsulation layer. Other embodiments of the optical devices are multi-layer stack optical devices that include the first layer stack and a second layer stack formed thereover. The second layer stack of the one or more layer stacks is disposed over the first layer stack. The second layer stack includes a second arrangement of a second plurality of pillars disposed on one of the first encapsulation layer and a spacer layer disposed on the first encapsulation layer. The materials, dimensions, and processes described herein of the encapsulation layers, and the composition of a space corresponding to a gap g provides for a height h of the pillars of about 1500 nm or less, such as from about 300 nm to about 1500 nm, such as from about 300 nm to about 500 nm. Lowering the height h of the pillars reduces the thickness of the layer stacks and total thickness of a flat optical device. The reduced total thickness of the flat optical devices provides for higher transmission efficiency due to impedance matching and device symmetry, as compared to bare optical devices, and reduced manufacturing complexity and cost.

While the foregoing is directed to embodiments of the present disclosure, other and further embodiments of the disclosure may be devised without departing from the basic scope thereof, and the scope thereof is determined by the claims that follow.

What is claimed is:
1. A device, comprising:
   a substrate having a first arrangement of a first plurality of pillars formed thereon, the first arrangement of the first plurality of pillars comprising:
      pillars having a height h and a lateral distance d; and
      a gap g corresponding to a distance between adjacent pillars of the first plurality of pillars, wherein an aspect ratio of the gap g to the height h is between about 1:1 and about 1:20;
   a first adhesion-promoting material disposed over the first arrangement of the first plurality of pillars;
   a gap-fill portion disposed over the first adhesion-promoting material and comprising a first material having a first refractive index; and
   a cap portion comprising a second material having a second refractive index and disposed over the first plurality of pillars, wherein the first refractive index and the second refractive index are different, the gap-fill portion filling the gap g between adjacent pillars of the first plurality of pillars, and the gap-fill portion and the cap portion form a first encapsulation layer.

2. The device of claim 1, wherein the first encapsulation layer comprises an amorphous fluoropolymer.

3. The device of claim 1, wherein the first encapsulation layer comprises least at one of poly(4,5-difluoro-2,2-bis(trifluoromethyl)-1,3-dioxole-co-tetrafluoroethylene) or perfluoro(3-butenyl vinyl ether) (PBVE) cyclopolymer.

4. The device of claim 1, wherein the first encapsulation layer comprises a tetrafluoroethylene copolymer.

5. The device of claim 1, wherein the first adhesion-promoting material comprises a fluorosilane.

6. The device of claim 1, wherein the first adhesion-promoting material comprises at least one of trichloro(1H,1H,2H,2H-perfluorooctyl)-silane, 1H,1H,2H,2H-perfluorooctyltriethoxysilane, 1H,1H,2H,2H-perfluorodecyltriethoxysilane, or trichloro(3,3,3-trifluoropropyl)-silane.

7. The device of claim 1, wherein the first adhesion-promoting material comprises hydrophobic tail groups.

8. The device of claim 1, wherein a contact angle of the first encapsulation layer on the first adhesion-promoting material is about 40° or less.

9. The device of claim 1, further comprising:
a second arrangement of a second plurality of pillars formed over the first encapsulation layer, the second arrangement of the second plurality of pillars comprising:
pillars having the height h and the lateral distance d; and
the gap g corresponding to a distance between adjacent pillars of the second plurality of pillars, wherein the aspect ratio of the gap g to the height h is between about 1:1 and about 1:20;
a second adhesion-promoting material disposed over the second arrangement of the second plurality of pillars; and
a second encapsulation layer disposed over the second adhesion-promoting material, the second encapsulation layer filling the gap g between adjacent pillars of the second plurality of pillars, the second encapsulation layer comprising a fluoropolymer.

10. A method, comprising:
forming a first arrangement of a first plurality of pillars on a surface of a substrate, the first arrangement of the first plurality of pillars comprising:
pillars having a height h and a lateral distance d; and
a gap g corresponding to a distance between adjacent pillars of the first plurality of pillars, wherein an aspect ratio of the gap g to the height h is between about 1:1 and about 1:20;
disposing a first adhesion-promoting material over the first arrangement of the first plurality of pillars; and
disposing a gap-fill portion over the first adhesion-promoting material and comprising a first material having a first refractive index; and
disposing a cap portion comprising a second material having a second refractive index disposed over the first plurality of pillars, wherein the first refractive index and the second refractive index are different, the gap-fill portion filling the gap g between adjacent pillars of the first plurality of pillars, and the gap-fill portion and the cap portion form a first encapsulation layer.

11. The method of claim 10, further comprising:
depositing the first adhesion-promoting material by spin-coating;
baking the first adhesion-promoting material at elevated temperature; and
repeating the operations of spin-coating and baking two or more times.

12. The method of claim 11, wherein the first adhesion promoting material is conformally deposited.

13. The method of claim 10, further comprising depositing the first encapsulation layer by at least one of spin-coating, dip-coating, spray-coating, or vapor draw.

14. The method of claim 10, further comprising:
forming a second arrangement of a second plurality of pillars on a surface of the first encapsulation layer, the second arrangement of the second plurality of pillars comprising:
pillars having the height h and the lateral distance d; and
the gap g corresponding to a distance between adjacent pillars of the second plurality of pillars, wherein an aspect ratio of the gap g to the height h is between about 1:1 and about 1:20;
disposing a second adhesion-promoting material over the second arrangement of the second plurality of pillars; and
disposing a second encapsulation layer over the second adhesion-promoting material, the second encapsulation layer filling the gap g between adjacent pillars of the second plurality of pillars, the second encapsulation layer comprising a fluoropolymer.

15. The method of claim 10, further comprising disposing a cap portion of the first encapsulation layer over the first plurality of pillars.

16. A device, comprising:
a substrate having a first arrangement of a first plurality of pillars formed thereon, the first arrangement of the first plurality of pillars comprising:
pillars having a first surface facing away from the substrate and one or more side surfaces facing adjacent pillars; and
trenches formed between adjacent pillars;
a first adhesion-promoting material disposed on the first surface and the one or more side surfaces of the pillars, the first adhesion-promoting material comprising a fluorosilane;
a gap-fill portion disposed over the first adhesion-promoting material and comprising a first material having a first refractive index; and
a cap portion comprising a second material having a second refractive index, wherein the first refractive index and the second refractive index are different, the gap-fill portion filling the trenches between adjacent pillars of the first plurality of pillars, and the gap-fill portion and the cap portion form a first encapsulation layer comprising an amorphous fluoropolymer.

17. The device of claim 16, wherein the first encapsulation layer comprises at least one of poly(4,5-difluoro-2,2-bis(trifluoromethyl)-1,3-dioxole-co-tetrafluoroethylene) or perfluoro(3-butenyl vinyl ether) (PBVE) cyclopolymer.

18. The device of claim 16, wherein the first adhesion-promoting material comprises at least one of trichloro(1H,1H,2H,2H-perfluorooctyl)-silane, 1H,1H,2H,2H-perfluorooctyltriethoxysilane, 1H,1H,2H,2H-perfluorodecyltriethoxysilane, or trichloro(3,3,3-trifluoropropyl)-silane.

19. The device of claim 16, wherein the pillars have a height h, wherein the trenches have a width corresponding to a distance between adjacent pillars of the first plurality of pillars, and wherein an aspect ratio of the width of the trenches to the height h is between about 1:1 and about 1:20.

20. The device of claim 16, wherein a cap portion of the first encapsulation layer is disposed over the first surface of the first plurality of pillars.

* * * * *